(12) United States Patent
Shimamura et al.

(10) Patent No.: US 12,193,219 B2
(45) Date of Patent: Jan. 7, 2025

(54) APPARATUSES OF CONTROLLING CROSS-LAYER REACTIONS IN SEMICONDUCTOR DEVICE

(71) Applicant: MICRON TECHNOLOGY, INC., Boise, ID (US)

(72) Inventors: Akie Shimamura, Hiroshima (JP); Kenichi Kusumoto, Hiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 156 days.

(21) Appl. No.: 17/688,743

(22) Filed: Mar. 7, 2022

(65) Prior Publication Data

US 2023/0209809 A1 Jun. 29, 2023

Related U.S. Application Data

(60) Provisional application No. 63/294,313, filed on Dec. 28, 2021.

(51) Int. Cl.
*H10B 12/00* (2023.01)
(52) U.S. Cl.
CPC ......... *H10B 12/482* (2023.02); *H10B 12/315* (2023.02); *H10B 12/34* (2023.02)
(58) Field of Classification Search
CPC ..... H10B 12/315; H10B 12/34; H10B 12/482
USPC .................................................. 257/906, 908
See application file for complete search history.

(56) References Cited

U.S. PATENT DOCUMENTS

| 6,617,248 | B1 | 9/2003 | Yang |
| 7,588,667 | B2 | 9/2009 | Cerio |
| 9,437,714 | B1 | 9/2016 | Adusumilli et al. |
| 2013/0344666 | A1* | 12/2013 | Moon ............... H10B 12/053 438/259 |
| 2021/0066309 | A1* | 3/2021 | Panda ................ C23C 28/34 |

OTHER PUBLICATIONS

U.S. Appl. No. 63/294,313 titled "Methods And Apparatuses of Controlling Cross-Layer Reactions In Semiconductor Device" filed Dec. 28, 2021.

* cited by examiner

*Primary Examiner* — Hoai V Pham
(74) *Attorney, Agent, or Firm* — Dorsey & Whitney LLP

(57) ABSTRACT

Apparatuses and methods for fabricating multilayer structures are described. An example method includes: forming a conductive base layer including silicon; forming a first conductive layer including first conductive material above the conductive base layer; forming a conductive barrier layer above the conductive layer; performing thermal loading to form a second conductive layer including silicide of the first conductive material between the conductive base layer and the conductive barrier layer; and forming a third conductive layer above the conductive barrier layer.

18 Claims, 4 Drawing Sheets

APPARATUSES OF CONTROLLING CROSS-LAYER REACTIONS IN SEMICONDUCTOR DEVICE

CROSS-REFERENCE TO RELATED APPLICATIONS

This application claims the filing benefit of U.S. Provisional Application No. 63/294,313, filed Dec. 28, 2021. This application is incorporated by reference herein in its entirety and for all purposes.

BACKGROUND

High data reliability, high speed of memory access, lower power consumption and reduced chip size are features that are demanded from semiconductor memory. Recently in semiconductor memory devices such as dynamic random access memories (DRAMs), static RAMs (SRAMs), flash memories, reduced layer thickness of each layer in a multilayer structure has been desired.

In order to achieve a reduced thickness of a conductive multilayer structure while maintaining low resistance and high conductivity, the conductive multilayer structure may include a layer including ruthenium (Ru). In the conductive multilayer structure, ruthenium (Ru) may be deposited on a conductive barrier layer that is on a conductive base layer. To obtain a thin multilayer structure, having a thin conductive barrier layer is desirable. However, a thin conductive barrier layer may results in undesirable reactions between the ruthenium (Ru) and conductive material in the conductive base layer. To prevent such reactions between the ruthenium (Ru) and the conductive material, the conductive barrier layer should have sufficient thickness. Having a conductive barrier layer with sufficient thickness may result in a thicker multilayer structure that is undesirable. Thus, methods or structures that provide a relatively thin conductive multilayer structure without having the problems associated with reactions between a conductive base layer and ruthenium (Ru) are desired.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
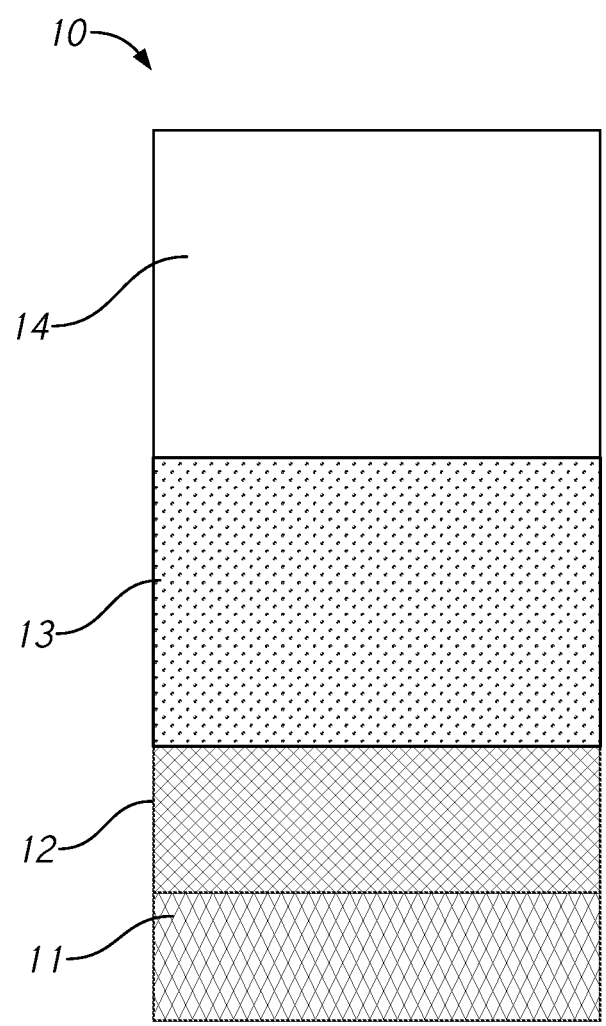
FIG. 1 is a vertical cross-sectional view of a multi-layer structure of a semiconductor device in accordance with an embodiment of the present disclosure.

Embodiments of the present disclosure including multi-layer conductive structures of semiconductor devices will be described with reference to FIG. 1 to FIG. 7. FIG. 1 is a vertical cross-sectional view of a multi-layer structure 10 of a semiconductor device in accordance with an embodiment of the present disclosure. The multi-layer structure 10 may be a conductive structure. The multi-layer structure 10 includes a conductive layer 11, a conducive layer 12 above the conductive layer 11, a conductive layer 13 above the conductive layer 12, and a conductive layer 14 above the conductive layer 13.

In some embodiments, the conductive layer 11 may be a conductive base layer. The conductive layer 11 may be disposed on at least one dielectric layer, such as an isolation layer. In some embodiments, the conductive layer 11 may include conductive material suitable for doping. For example, the conductive layer 11 may include polycrystalline silicon (poly-Si) that may be doped n-type or p-type.

The conductive layer 12 may include silicide of conductive material. In some embodiments, the conductive layer 12 may include metal silicide. For example, the conductive layer 12 may include titanium silicide (TiSix). In some embodiments, the conductive layer 12 may provide ohmic contact with the conductive layer 11 and reduce resistance at an interface between the conductive layer 11 and the conductive layer 12.

In some embodiments, the conductive layer 13 may include nitride of conductive material. For example, the conductive layer 13 may include titanium nitride (TiN). The conductive layer 14 may be an electrode including conductive material with relatively low resistance. For example, the conductive layer 14 may include ruthenium (Ru).

In some embodiments, the conductive layers 12 and 13 may be conductive barrier metal layers. For example, the conductive layers 12 and 13 may act as a diffusion barrier to reduce reactions between materials included in the conductive layer 11 below and in the conductive layer 14 above, during a thermal process with a high temperature above 900° C.

Thus, the conductive layers 12 and 13 may protect the conductive layer 11 below and material included in the conductive layer 14 during the thermal process.

Figure 2:
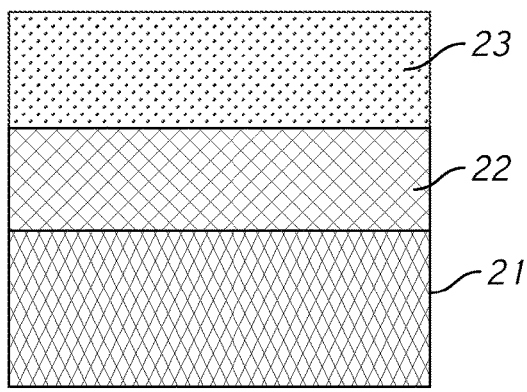
FIG. 2 is a vertical cross-sectional view of a structure of the multi-layer structure of the semiconductor device in accordance with an embodiment of the present disclosure.

FIG. 2 is a vertical cross-sectional view of a structure 20 of the multi-layer structure 10 of the semiconductor device in accordance with an embodiment of the present disclosure.

In some embodiments, the structure 20 may be an intermediate structure that is used to fabricate the multi-layer structure 10 of the semiconductor device of FIG. 1. The structure 20 includes a conductive layer 21, a conducive layer 22 above the conductive layer 21, and a conductive layer 23 above the conductive layer 22.

In some embodiments, the conductive layer 21 may be a conductive base layer. The conductive layer 21 may be disposed on at least one dielectric layer, such as an isolation layer.

In some embodiments, the conductive layer 21 may include conductive material suitable for ion implantation (e.g., doping). For example, the conductive layer 21 may include polycrystalline silicon (poly-Si).

The conductive layer 21 may be formed by depositing polycrystalline silicon (poly-Si) using chemical vapor deposition (CVD), such as low-pressure CVD (LPCVD) or plasma-enhanced CVD (PECVD), on the at least one dielectric layer. Following the deposition of polycrystalline silicon (poly-Si), the conductive layer 21 may be doped with n-type or p-type impurities. A silicon oxide layer may naturally be added on a top surface of the conductive layer 21. Such natural oxide layer may be removed.

The conductive layer 22 may be disposed on the conductive layer 21. The conductive layer 22 may include conductive material. In some embodiments, the conductive layer 22 may include metal, such as titanium (Ti). In some embodiments, a thickness of the conductive layer 22 may be approximately 15-20 Å. The conductive layer 23 may be disposed on the conductive layer 22. In some embodiments, the conductive layer 23 may include nitride of conductive material. For example, the conductive layer 23 may include metal nitride, such as titanium nitride (TiN). In some embodiments, a thickness of the conductive layer 23 may be approximately 15-30 Å. However, while specific respective thickness ranges have been provided for the conductive layers 22 and 23, the thicknesses of conductive layers 22 and 23 may be greater or less than the respective ranges without departing from the scope of the disclosure.

In some embodiments, the conductive layers 22 and 23 may be forming depositing the conductive material using either chemical vapor deposition (CVD) or physical vapor deposition (PVD) consecutively in one semiconductor manufacturing apparatus. In some embodiments, each conductive layer of the conductive layers 22 and 23 may be formed in each separate chamber connected by a vacuum transfer chamber in the semiconductor manufacturing apparatus.

Figure 3:
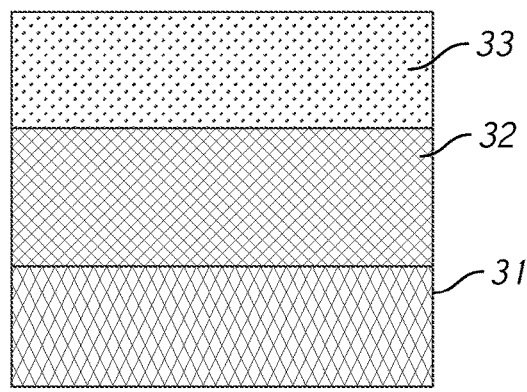
FIG. 3 is a vertical cross-sectional view of a structure of the multi-layer structure of the semiconductor device in accordance with an embodiment of the present disclosure.

FIG. 3 is a vertical cross-sectional view of a structure 30 of the multi-layer structure 10 of the semiconductor device in accordance with an embodiment of the present disclosure.

In some embodiments, the structure 30 may be an intermediate structure that is used to fabricate the multi-layer structure 10 of the semiconductor device of FIG. 1. In some embodiments, the structure 30 may be fabricated by performing one or more fabrication processes on the structure 20 of FIG. 2.

The structure 20 may be processed by thermal loading and results in the structure 30. In some embodiments, the thermal loading may be performed by rapid thermal processing (RTP) at a temperature within a range from approximately 600° C. to approximately 900° C. The structure 30 includes a conductive layer 31, a conducive layer 32 above the conductive layer 31, and a conducive layer 33 above the conductive layer 32. By performing the thermal loading, titanium silicide (TiSix) may be formed at an interface of polycrystalline silicon (poly-Si) of the conductive layer 21 and titanium (Ti) of the conductive layer 22. As the thermal loading progresses, the reaction between silicon (Si) in polycrystalline silicon (poly-Si) and titanium (Ti) also progresses, and titanium (Ti) of the conductive layer 22 may in part or in whole be replaced with titanium silicide (TiSix). Thus the conductive layer 32 including titanium silicide (TiSix) may be formed. In some embodiments, the conductive layer 33 may be the conductive layer 23. The conductive layer 33 may include nitride of conductive material. For example, the conductive layer 33 may include metal nitride, such as titanium nitride (TiN).

Figure 4:
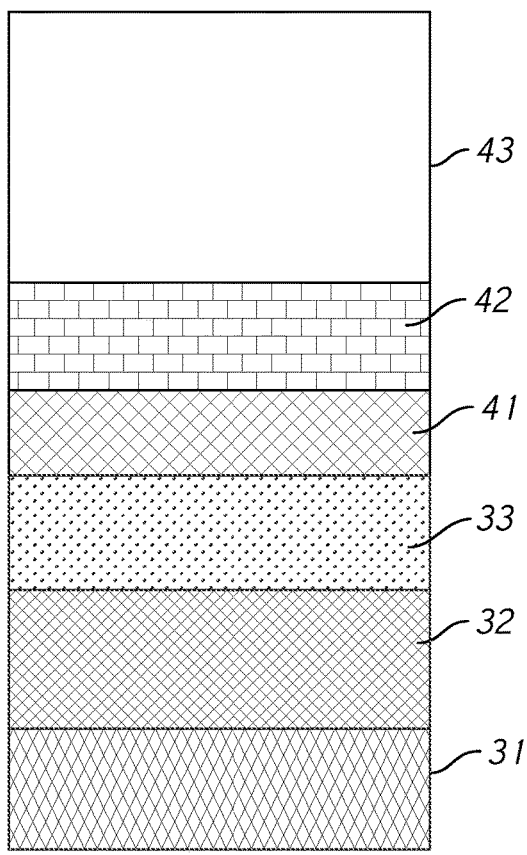
FIG. 4 is a vertical cross-sectional view of a structure of the multi-layer structure of the semiconductor device in accordance with an embodiment of the present disclosure.

FIG. 4 is a vertical cross-sectional view of a structure 40 of the multi-layer structure 10 of the semiconductor device in accordance with an embodiment of the present disclosure.

In some embodiments, the structure 40 may be an intermediate structure that is used to fabricate the multi-layer structure 10 of the semiconductor device of FIG. 1. In some embodiments, the structure 40 may be fabricated by performing one or more fabrication processes on the structure 30 of FIG. 3. The structure 40 includes the conductive layers 31-33, a conducive layer 41 above the conductive layer 33, a conductive layer 42 above the conductive layer 41, and a conductive layer 43 above the conductive layer 42.

In some embodiments, the conductive layer 41 may be disposed on the conductive layer 33, such as a top layer of the structure 30 after thermal loading. In some embodiments, the conductive layer 41 may include conductive material. For example, the conductive layer 41 may include metal, such as titanium (Ti). In some embodiments, a thickness of the conductive layer 41 may be approximately 10-20 Å. The conductive layer 42 may be disposed on the conductive layer 41. The conductive layer 42 may include conductive material. In some embodiments, the conductive layer 42 may include nitride of conductive material included in the conductive layer 43. For example, the conductive layer 42 may include metal nitride, such as ruthenium nitride (RuN). In some embodiments, a thickness of the conductive layer 42 may be approximately 10-20 Å. In some embodiments, the conductive layer 43 may include conductive material. For example, the conductive layer 43 may include metal, such as ruthenium (Ru). The conductive layer 43 may be disposed on the conductive layer 42.

In some embodiments, the conductive layers 41-43 may be formed by depositing the conductive material using either CVD or PVD consecutively in one semiconductor manufacturing apparatus. In some embodiments, each conductive layer of the conductive layers 41-43 may be formed in a separate chamber connected by a vacuum transfer chamber in the semiconductor manufacturing apparatus.

Figure 5:
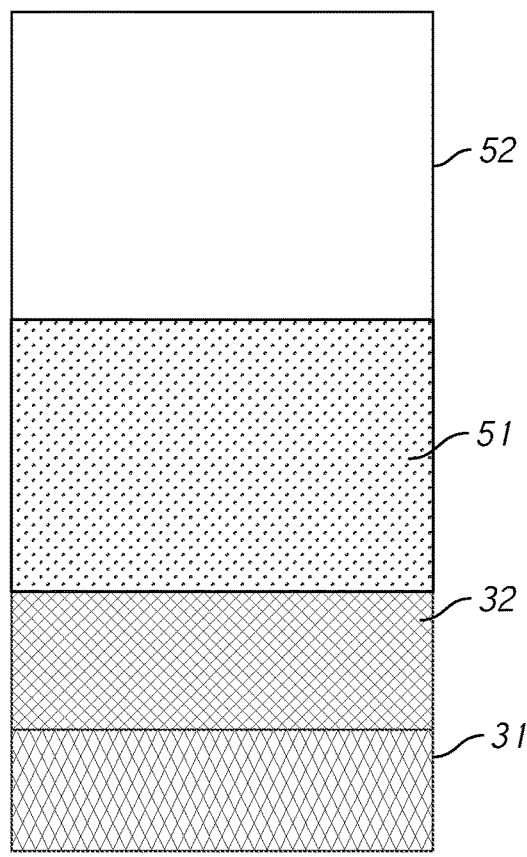
FIG. 5 is a vertical cross-sectional view of a multi-layer structure of a semiconductor device in accordance with an embodiment of the present disclosure.

FIG. 5 is a vertical cross-sectional view of a structure 50 of the multi-layer structure 10 of the semiconductor device in accordance with an embodiment of the present disclosure. In some embodiments, the structure 50 may be a final structure that is the multi-layer structure 10 of the semiconductor device of FIG. 1. In some embodiments, the structure 50 may be fabricated by performing one or more fabrication processes on the structure 40 of FIG. 4.

The structure 40 may be processed by thermal loading, which results in the structure 50. In some embodiments, another thermal loading may be performed. For example, another thermal loading may be performed by annealing for dopant activation after forming components above the structure 40. In some embodiments, annealing, such as rapid thermal processing (RTP), at a temperature higher than 900° C. may be performed. The conductive layers 41 and 42 may be precursors to form an upper portion of a conductive layer 51. By performing the thermal loading, titanium nitride (TiN) may be formed at an interface of titanium (Ti) of the conductive layer 41 and ruthenium nitride (RuN) of the conductive layer 42.

As annealing progresses, the reaction between titanium (Ti) and nitrogen (N) from the ruthenium nitride (RuN) also progresses, and as a result, titanium nitride (TiN) may replace titanium (Ti). Thus, an upper portion of the conductive layer 51 including titanium nitride (TiN) may be formed. In some embodiments, the upper portion of the conductive layer 51 may have a thickness greater than the thickness of the conductive layer 41. The conductive layer 33 including titanium nitride (TiN) below the conductive layer 41 becomes a lower portion of the conductive layer 51 (with the upper portion of the conductive layer 51 representing the difference in thickness between the conductive layer 33 and the conductive layer 51). Thus, a conductive barrier layer 51 may be formed after annealing. During annealing, ruthenium nitride (RuN) of the conductive layer 42 releases nitrogen (N) and becomes a lower portion of a conductive layer 52 that includes ruthenium (Ru). The conductive layer 43 including ruthenium (Ru) forms an upper portion of the conductive layer 52. The conductive layer 52 may be an electrode having thickness greater than a thickness of the conductive layer 43 formed after annealing.

Figure 6:
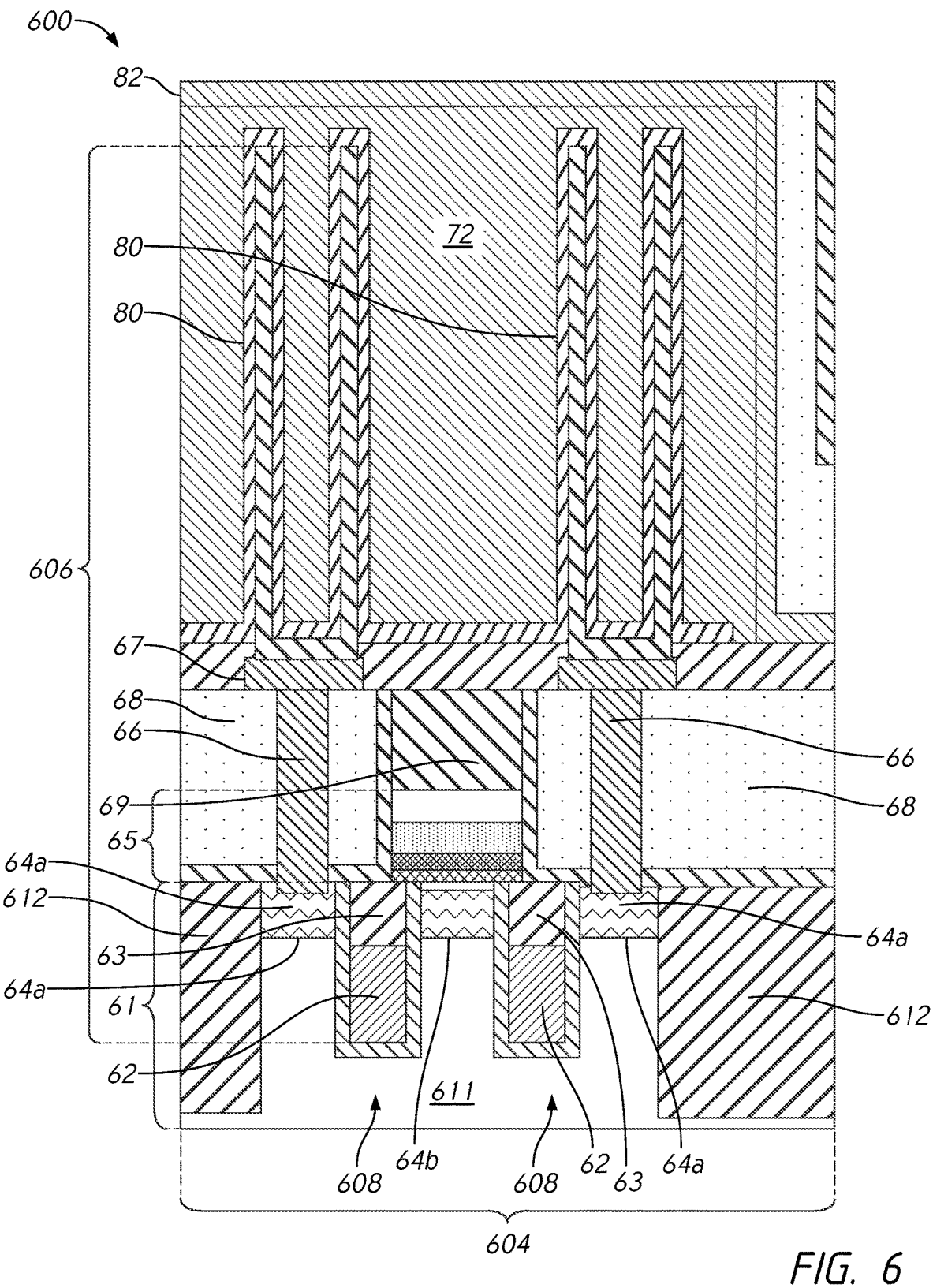
FIG. 6 is a vertical cross-sectional view of a portion of a semiconductor memory device including a memory array region in accordance with an embodiment of the present disclosure.
Figure 7:
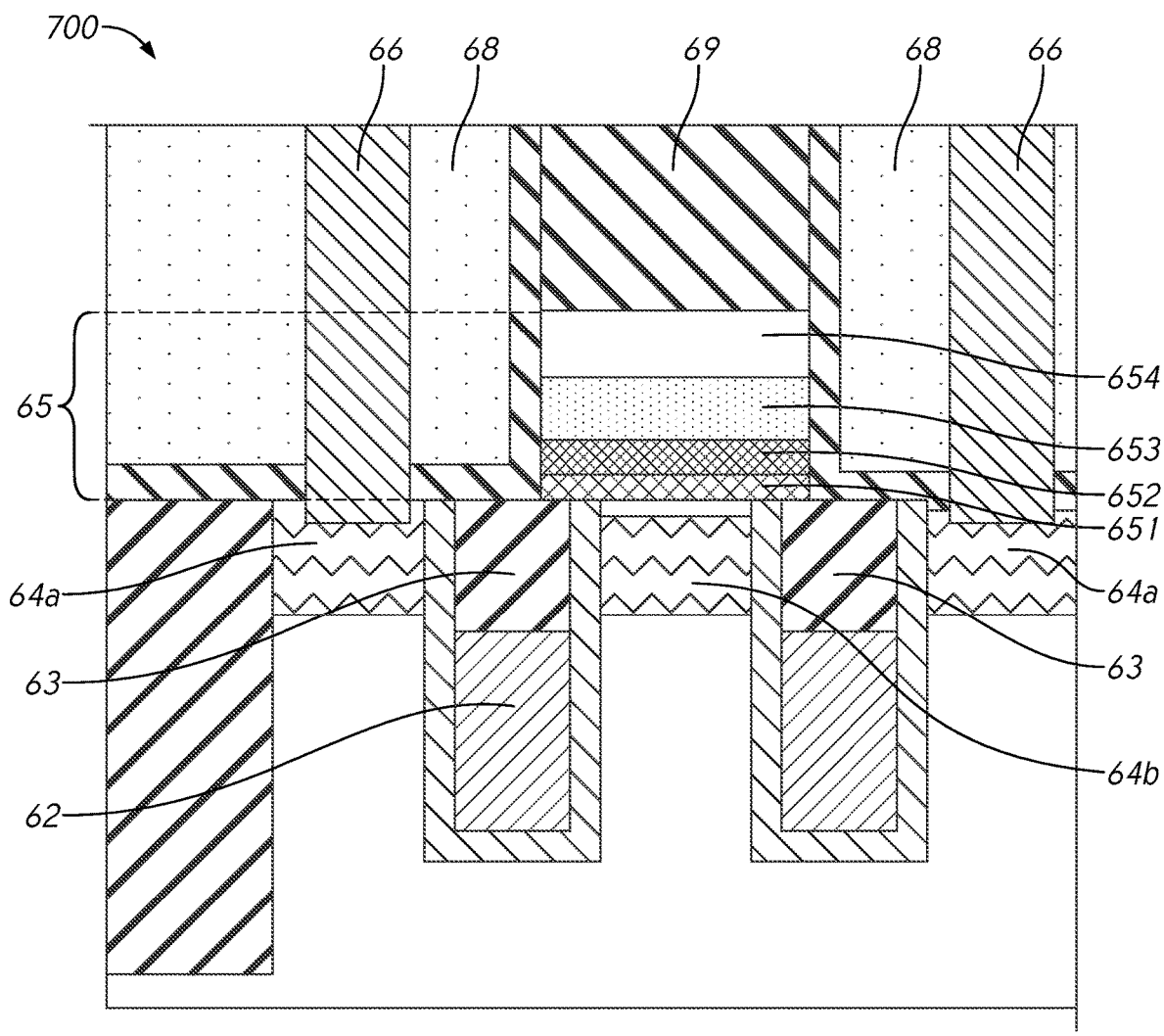
FIG. 7 is a vertical cross-sectional view of a multi-layer structure of a bit line of the semiconductor memory device in accordance with an embodiment of the present disclosure.

The description with regards to FIGS. 6 and 7 uses a dynamic random-access memory (DRAM) as an illustrative example of a semiconductor memory device.

FIG. 6 is a vertical cross-sectional view of a portion 600 of a semiconductor memory device including a memory array region 604 in accordance with one embodiment of the present disclosure. The portion 604 is fabricated in a FEOL above a substrate 602. The portion fabricated in the FEOL includes a memory cell 606 in the memory cell region 604. The memory cell 606 may be disposed on a substrate 602. The memory cell 606 may include transistors 608 on the substrate 602 and capacitors 80 coupled to the transistors 608.

The portion 600 may include a substrate 61 including an active region 611, gate electrodes 62 and an isolation layer 612, and dielectric layers 63 above the gate electrodes. The substrate 61 may include monocrystalline silicon, for example. In some embodiments, openings in the substrate 61 may be formed. Openings may include openings around the active region 611 and openings in the active region 611. Openings around the active region 611 are provided to form shallow trench isolation 612 in the openings between adjacent active regions, and openings in the active region 611 are provided to isolate drains and sources in the active region 611. Each word line (the gate electrode 62) may be formed in each opening in the active region 611. The dielectric layer 63 may be formed to partially fill the openings in and around the active region 611. Thus, each word line (the gate electrode 62) may be embedded between the substrate 61 and the dielectric layer 63.

In some embodiments, the gate electrodes 62 may be word lines. The gate electrodes 62 may be gates of transistors. Each of the transistors may include a source (e.g., one of impurity diffusion layers 64a and 64b) and a drain (e.g., the other of the impurity diffusion layers 64a and 64b) disposed on either side of the gate electrode 62 on the substrate 61. Each of the transistors may be an access transistor of each memory cell, embedded in the substrate 61. A dielectric layer 68 may be formed on the substrate 61. One or more bit lines 65 may be formed in the dielectric layer 68. The one or more bit lines 65 are disposed on the impurity diffusion layer 64b. The one or more bit lines 65 may intersect the word lines (the gate electrodes 62) when viewed from a direction perpendicular to the one or more bit lines 65 and the word lines (the gate electrodes 62). A plurality of memory cells 606 are disposed at the intersections of the one or more bit lines 65 and the word lines (the gate electrodes 62). As will be described in more detail below with reference to FIG. 7, the one or more bit lines 65 may include a multi-layer structure formed by a fabrication process according to an embodiment of the disclosure. A dielectric layer 69 may be formed in the dielectric layer 68. The dielectric layer 69 is disposed on the one or more bit lines 65 to cover the one or more bit liners 65. The plugs 66 may be formed through the dielectric layer 68. The plugs 66 may be formed above the impurity diffusion layers 64a. Each contact pad 67 may couple the source or the drain at each impurity diffusion layer 64a coupled to each plug 66 to each capacitor 80.

A dielectric layer 72 may be disposed above the dielectric layer 68. The capacitors 80 are disposed in in the dielectric layer 72, and a plate electrode 82 is disposed above and one or more sides of the capacitors 80. Lower ends of the capacitors 80 may contact the plugs 66 at the contact pad 67.

FIG. 7 is a vertical cross-sectional view of a portion 700 including a portion of a bit line 65 of the semiconductor memory device in accordance with one embodiment of the present disclosure. In some embodiments, the portion 700 may be at an intersection of a word line (a gate electrode 62).

The bit line 65 may include a multi-layer structure that includes a conductive layer 651, a conductive layer 652 above the conductive layer 651, a conductive layer 653 above the conductive layer 652, and a conductive layer 654 above the conductive layer 653. The conductive layers 651-654 may be formed by the fabrication process of the multi-layer structure 10 described with reference to FIGS. 2-5. In some embodiments, the conductive layer 651 may be a conductive base layer. The conductive layer 651 may be disposed on the isolation layer 63. In some embodiments, the conductive layer 651 may include conductive material suitable for doping. For example, the conductive layer 651 may include polycrystalline silicon (poly-Si) that may be doped n-type or p-type. The conductive layer 652 may include silicide of conductive material. In some embodiments, the conductive layer 652 may include metal silicide. For example, the conductive layer 652 may include titanium silicide (TiSix). In some embodiments, thermal loading may be performed by rapid thermal processing (RTP) at a temperature within a range from approximately 600° C. to approximately 900° C. and the conductive layer 652 may be formed. In some embodiments, the conductive layer 652 may provide ohmic contact with the conductive layer 651 and reduce resistance at an interface between the conductive layer 651 and the conductive layer 652. The conductive layers 652 and 653 may be conductive barrier metal layers. The conductive layers 652 and 653 may act as a diffusion barrier to reduce reactions between materials included in the conductive layer 651 below and in the conductive layer 654 above, during thermal loading with a high temperature above 900° C. The thermal loading with the temperature above 900° C. may be performed for dopant activation. The conductive layers 652 and 653 may protect the conductive layer 651 below and material included in the conductive layer 654 from undesired reactions during the thermal process for dopant activation. In some embodiments, the conductive layer 653 may include nitride of conductive material. For example, the conductive layer 653 may include titanium nitride (TiN). The conductive layer 654 may be an electrode including conductive material with relatively low resistance. For example, the conductive layer 654 may include ruthenium (Ru).

By forming a lower portion and a upper portion of a bit line separately and performing thermal loading at a lower temperature than a temperature for dopant activation between forming the lower and upper portions, a conductive base layer and a conductive layer with low resistance may be protected from reactions through a conductive barrier layer between the conductive base layer and the conductive layer with low resistance. By including precursor layers for forming the upper portion of the bit line, thicknesses of the conductive barrier layer and the conductive layer with low resistance may be increased after dopant activation. Thus, conductivity and compactness of bit lines may be achieved.

A silicide layer of conductive material and a conductive barrier layer may be formed above a conductive base layer at a temperature lower than a temperature for dopant activation during fabrication of a multi-layer structure. Conductive layers formed above the conductive barrier layer may act as precursors that increase the conductive barrier layer and a conductive layer with low resistance due to the high temperature, such as above 900° C. for dopant activation. By providing the metal silicide layer at the lower temperature and further providing the conductive layers as precursors prior to the high temperature dopant activation, reactions between the conductive base layer and the conductive layer with low resistance may be decelerated compared to reactions during formation of the same structure using one thermal loading for the dopant activation. The increased conductive barrier layer may provide effective barriers between the conductive base layer and the conductive layer with low resistance while increasing the conductivity of the conductive layer with low resistance for even lower resistance. Thus, the finer multi-layer structure with lower resistance may be formed.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus, comprising:
   a conductive base layer including silicon;
   a first conductive layer including silicide of a conductive material above the conductive base layer;
   a conductive barrier layer above the first conductive layer; and
   a second conductive layer above the conductive barrier layer,
   wherein the conductive barrier layer has a first thickness that is greater than a thickness of a first precursor conductive layer configured to form at least a lower portion of the conductive barrier layer and that is greater than a thickness of a second precursor conductive layer configured to form at least an upper portion of the conductive barrier layer,
   wherein the second conductive layer has a second thickness that is greater than a thickness of a third precursor conductive layer configured to form at least a lower portion of the second conductive layer and that is greater than a thickness of a fourth precursor conductive layer configured to form at least an upper portion of the second conductive layer, and
   wherein the second conductive layer includes ruthenium, the third precursor conductive layer includes ruthenium nitride, and the fourth precursor conductive layer includes ruthenium.

2. The apparatus of claim 1, wherein the first conductive layer is formed by forming a third conductive layer of the conductive material between forming the conductive base layer and forming the conductive barrier layer prior to the thermal loading.

3. The apparatus of claim 1, wherein the thermal loading is performed at a temperature within a range from 600° C. to 900° C.

4. The apparatus of claim 1, wherein the second conductive layer includes ruthenium.

5. The apparatus of claim 1, wherein the conductive barrier layer comprises:
   the lower portion formed prior to the thermal loading; and
   the upper portion formed after the thermal loading.

6. The apparatus of claim 5, wherein the thermal loading is first thermal loading performed at a first temperature;
   wherein the second conductive layer includes a lower portion and an upper portion;
   wherein the upper portion of the conductive barrier layer and the lower portion of the second conductive layer are formed responsive to second thermal loading performed at a second temperature higher than the first temperature.

7. The apparatus of claim 5, wherein the conductive barrier layer has the first thickness of 20-70 Å.

8. The apparatus of claim 1, wherein
   the conductive barrier layer includes titanium nitride,
   the first precursor conductive layer includes titanium nitride, and
   the second precursor conductive layer includes titanium.

9. The apparatus of claim 1, wherein the first conductive layer is formed by thermal loading prior to forming the second conductive layer.

10. An apparatus, comprising:
    a memory cell array region including:
      a substrate;
      an isolation layer above the substrate;
      one or more word lines embedded between the substrate and the isolation layer; and
      a bit line on the isolation layer, including:
        a conductive base layer including silicon on the isolation layer;
        a first conductive layer including silicide of conductive material above the conductive base layer;
        a conductive barrier layer above the first conductive layer; and
        a second conductive layer as an electrode above the conductive barrier layer,
      wherein the conductive barrier layer has a first thickness that is greater than a thickness of a first precursor conductive layer configured to form at least a lower portion of the conductive barrier layer and that is greater than a thickness of a second precursor conductive layer configured to form at least an upper portion of the conductive barrier layer,
      wherein the second conductive layer has a second thickness that is greater than a thickness of a third precursor conductive layer configured to form at least a lower portion of the second conductive layer and that is greater than a thickness of a fourth precursor conductive layer configured to form at least an upper portion of the second conductive layer, and wherein the second conductive layer includes ruthenium, the third precursor conductive layer includes ruthenium nitride, and the fourth precursor conductive layer includes ruthenium.

11. The apparatus of claim 10, wherein the first conductive layer is formed by forming a third conductive layer of the conductive material between forming the conductive base layer and forming the conductive barrier layer prior to the thermal loading.

12. The apparatus of claim 10, wherein the thermal loading is performed at a temperature within a range from 600° C. to 900° C.

13. The apparatus of claim 10, wherein the second conductive layer includes ruthenium (Ru).

14. The apparatus of claim 10, wherein the conductive barrier layer comprises:
the lower portion formed prior to the thermal loading; and
the upper portion formed after the thermal loading.

15. The apparatus of claim 14, wherein the thermal loading is first thermal loading performed at a first temperature;
wherein the second conductive layer includes a lower portion and an upper portion;
wherein the upper portion of the conductive barrier layer and the lower portion of the second conductive layer are formed as reaction to second thermal loading performed at a second temperature higher than the first temperature.

16. The apparatus of claim 14, wherein the conductive barrier layer has the first thickness of 20-70 Å.

17. The apparatus of claim 10, wherein
the conductive barrier layer includes titanium nitride,
the first precursor conductive layer includes titanium nitride, and
the second precursor conductive layer includes titanium.

18. The apparatus of claim 10, wherein the first conductive layer is formed by thermal loading prior to forming the second conductive layer.

* * * * *